United States Patent
Falk et al.

(10) Patent No.: US 9,546,907 B2
(45) Date of Patent: Jan. 17, 2017

(54) DYNAMIC DIFFERENTIAL THERMAL MEASUREMENT SYSTEMS AND METHODS

(71) Applicant: Quantum Focus Instruments Corporation, Vista, CA (US)

(72) Inventors: R. Aaron Falk, Newcastle, WA (US); Tram Pham, Renton, WA (US); Anthony Ruiz, Vista, CA (US)

(73) Assignee: Quantum Focus Instruments Corporation, Vista, CA (US)

( * ) Notice: Subject to any disclaimer, the term of this patent is extended or adjusted under 35 U.S.C. 154(b) by 77 days.

(21) Appl. No.: 14/256,823

(22) Filed: Apr. 18, 2014

(65) Prior Publication Data

US 2015/0300882 A1  Oct. 22, 2015

(51) Int. Cl.
  *G01J 5/00* (2006.01)
  *G01R 31/311* (2006.01)
  *G01J 5/02* (2006.01)

(52) U.S. Cl.
  CPC .............. *G01J 5/0096* (2013.01); *G01J 5/025* (2013.01); *G01R 31/311* (2013.01); *G01J 2005/0077* (2013.01)

(58) Field of Classification Search
  CPC ............ G01R 31/2874; G01R 31/2875; G01R 31/2891; H01L 2924/0002; H01L 2924/00
  USPC ..................................................... 324/750.03
  See application file for complete search history.

(56) References Cited

U.S. PATENT DOCUMENTS

| | | | | | |
|---|---|---|---|---|---|
| 3,803,413 | A | * | 4/1974 | Vanzetti | G01R 31/309 250/338.1 |
| 3,868,508 | A | * | 2/1975 | Lloyd | G01R 31/2806 250/330 |
| 5,208,528 | A | * | 5/1993 | Quintard | G01R 31/309 250/330 |
| 6,840,666 | B2 | * | 1/2005 | Enachescu | G01R 31/308 250/341.4 |
| 7,891,864 | B2 | * | 2/2011 | Yazawa | G01R 31/2874 219/201 |
| 8,029,186 | B2 | * | 10/2011 | Hamann | H01L 23/34 324/537 |
| 8,038,343 | B2 | * | 10/2011 | Hamann | H01L 23/34 324/537 |

OTHER PUBLICATIONS

A. Vageswar, Krishnan Balasubramaniam, and C.V. Krishnamurthy; Extending Flash Thermography Method for Thermal Diffusivity Measurements using Finite Pulse Widths; 10th International Conference on Quantitative InfraRed Thermography; Jul. 27-30, 2010, Québec (Canada); pp. 1-5.*

(Continued)

*Primary Examiner* — Jermele M Hollington
*Assistant Examiner* — Christopher McAndrew
(74) *Attorney, Agent, or Firm* — Lee & Hayes, PLLC

(57) ABSTRACT

Dynamic Digital Modulation obtains thermal image data on active semiconductor devices with sufficient sensitivity to be used in situ with packaged devices. These techniques can be applied to dynamic failures, but can also produce quantitative data of actual power dissipation as the device is placed into different operational modes. The thermal image results can be analyzed to assist in thermal management and assessing reliability and failure analysis issues in semiconductor devices.

20 Claims, 10 Drawing Sheets

(56) References Cited

OTHER PUBLICATIONS

S. A. Merryman and R. M. Nelms, "Diagnostic technique for power systems utilizing infrared thermal imaging," in IEEE Transactions on Industrial Electronics, vol. 42, No. 6, pp. 615-628, Dec. 1995.*
Sherief Reda, Ryan J. Cochran, and Abdullah Nazma Nowroz; Improved Thermal Tracking for Processors Using Hard and Soft Sensor Allocation Techniques; IEEE Transactions on Computers, vol. 60, No. 6, Jun. 2011; pp. 841-851.*
Mirela Susa, Clemente Ibarra-Castanedo, Xavier Maldague and Abelhakim Bendada, Srecko Svaic, Ivanka Boras; Pulse thermography applied on a complex structure sample: comparison and analysis of numerical and experimental results; IV Conferencia Panamericana de END Buenos Aires—Oct. 2007; pp. 1-12.*
A. Vageswar, Krishnan Balasubramaniam, and C.V. Krishnamurthy; Extending Flash Thermography Method for Thermal Diffusivity Measurements using Finite Pulse Widths; 10th International Conference on Quantitative InfraRed Thermography; Jul. 27-30, 2010, Quebec (Canada); pp. 1-5.*

\* cited by examiner

402

DYNAMIC DIFFERENTIAL THERMAL MEASUREMENT SYSTEMS AND METHODS

BACKGROUND

Thermal imaging is a traditional technique for thermal management, failure analysis and reliability studies of semiconductor devices (see for example, G. C. Albright, J. A. Stump, J. D. McDonald, H. Kaplan, "True" Temperature Measurements on Microscopic Semiconductor Targets", SPIE Conference on Thermosense (*SPIE* Vol. 3700) 1999). However, limitations occur in thermal sensitivity, especially in the face of complex backgrounds and the need to exercise complex circuit structures in order to stimulate the desired site within a device.

Enhanced signal-acquisition techniques, such as binary sampling or quadrature sampling (e.g., Lock-in Thermography S. Kiefer, et al., "Infrared Microthermography for Integrated Circuit Fault Location; Sensitivity and Limitations", Proceedings of the 28th International Symposium for Testing and Failure Analysis (ISTFA) 2002) that rely on modulating a power supply have extended basic hotspot detection for failure analysis to extremes of sensitivity and show some ability to determine defective depth in simple structures (C. Schmidt, F. Altmann, "Non-Destructive Defect Depth Determination at Fully Packaged and Stacked Die Devices using Lock-in Thermography", 17th IEEE International Symposium on the Physical and Failure Analysis of Integrated Circuits (IPFA), 2010).

Binary signal enhancement techniques have been commercially available for many years. Simple binary pulse modulation consists of a single image sample being obtained at each power-on and power-off state, using a synchronously pulse-modulated power supply that is connected to the semiconductor device under test (DUT). This pair of images is digitally subtracted to produce a differenced image in which the common background is removed and only the thermal difference between the on and off power states remains. Averaging multiple pairs of signal samples over tens of minutes allows detection of shorts that are dissipating only a few microwatts.

Recent efforts have focused on quadrature sampling in which two images are taken during the device's power-on state and two during the power-off state. The four images are then combined to produce in-phase and out-of-phase images. An inverse tangent of their ratio produces an additional phase angle image.

These pulse sampling thermography (PST) techniques, described above, have been used for a variety of failure localization applications on static failures. However, there are many dynamic thermal issues in either failure analysis or reliability that require the DUT to be fully on and then placed into a specific state in order for the issue to be become manifest. Desirable thermal measurements are not currently realized.

SUMMARY

This disclosure provides new techniques of dynamic digital modulation for obtaining thermal image data on active semiconductor devices with sufficient sensitivity to be used in situ with packaged devices. These techniques can be applied to dynamic failures but can also produce quantitative data of actual power dissipation as the device is placed into different operational modes. The thermal image results can be analyzed to assist in thermal management and assessing reliability and failure analysis issues in semiconductor devices.

An exemplary system includes a device under test (DUT), a thermal camera that produces a plurality of thermal images of the DUT, a computer device and a control unit. The DUT is placed in a first operational state and the processing device acquires at least one first thermal image of the DUT from the thermal camera, based on a first signal. Then, the DUT is placed in a second operational state and the processing device acquires at least one second thermal image of the DUT from the thermal camera based on a second signal. The processing device generates at least one output image, based on a difference between the at least one first thermal image and the at least one second thermal image and the output image is presented by the output device.

In one embodiment, the output image includes a thermal difference image, a thermal time-constant map or a power dissipation map.

In another embodiment, the first operational state or second operational state includes an active operational state. Exemplary operational states include a state of a pulse width modulation cell or a multiplier cell.

BRIEF DESCRIPTION OF THE DRAWINGS

The detailed description is described with reference to the accompanying figures. The same reference numbers in different figures indicate similar or identical items.

DETAILED DESCRIPTION

Figure 1:
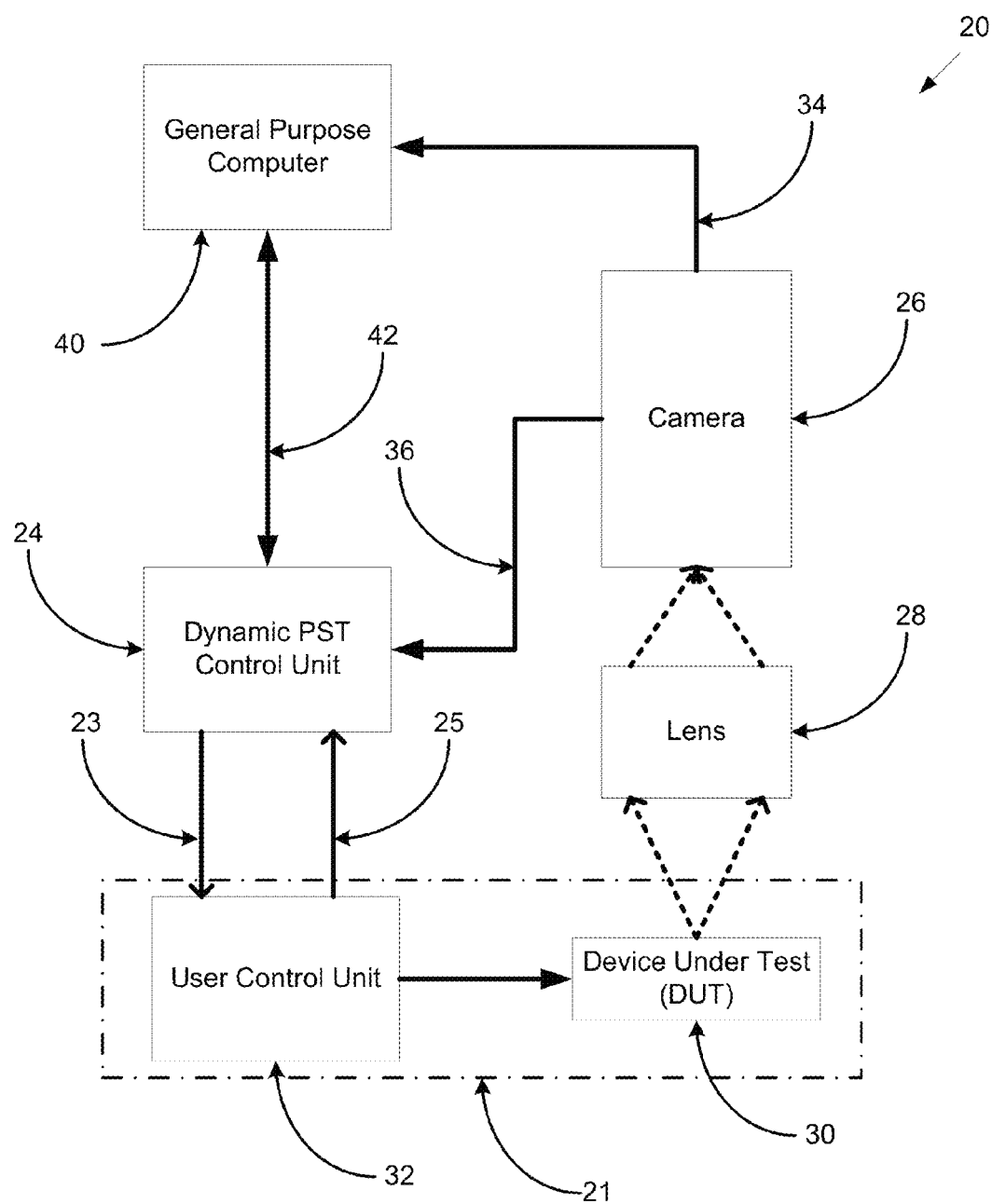
FIG. 1 illustrates an exemplary system formed in accordance with an exemplary embodiment.

FIG. 1 is an exemplary dynamic differential thermal measurement (DDTM) system 20. The system 20 includes a semiconductor measurement unit 21 shown in dot/dashed line, which includes two components (a user control unit (UCU) 32 and a device under test (DUT) 30. These two components 32 and 30 can be separate items as in a development/controller board connected to an integrated circuit to be tested. Alternatively, devices such as microcontrollers and microprocessors that have internal programming capability and external control lines can act as both the UCU 32 and the DUT 30. In either case, two digital control lines 23 and 25 are used to communicate between the UCU 32 and a pulse-sampling thermography control unit (PSTCU) 24.

The line 23 allows the PSTCU 24 to signal a start/ready condition to the UCU 32. The line 25 allows the UCU 32 to signal a start/ready condition to the PSTCU 24. These signals are used to coordinate the state condition of the DUT 30 with respect to the other parts of the DDTM system 20.

A thermal camera 26 uses a lens 28 to produce an optical image of the DUT 30. In one embodiment, the optical emissions from the DUT 30 are due to thermal photons produced by heating of electrical elements of the DUT as currents flow through them. However, this same technique can in principle be applied to any source of emission from the DUT 30, such as electron-hole recombination radiation.

The camera 26 produces two electrical signals of interest, an image signal and a frame trigger (or framing signal) on lines 34 and 36, respectively. The image signal can be in the form of analog or digital image data that are sent to a computing device 40 for digital processing and display. Many types of camera-to-computer interfaces are commercially available. The framing signal on line 36 is typically a short digital pulse from the camera 26 that signals the beginning of a frame sequence in the camera 26. The framing signal is sent to the PSTCU 24, which uses it to coordinate the state condition of the DUT 30 with respect to the other components of the DDTM system 20.

A digital communications signal sent on line 42 (e.g., USB or other two-way digital communication lines) located between the computing device 40 and the PSTCU 24 allows the computing device 40 to send instructions to the PSTCU 24. These instructions include "setup in duplex mode," "start data acquisition," or comparable instructions. In one embodiment, the instructions include numerical parameters, such as delay times. The line 42 also allows the PSTCU 24 to send responses to the computing device 40 such as "duplex mode set" and to send messages to the computing device 40 such as "acquire current camera 26 frame".

Figure 2:
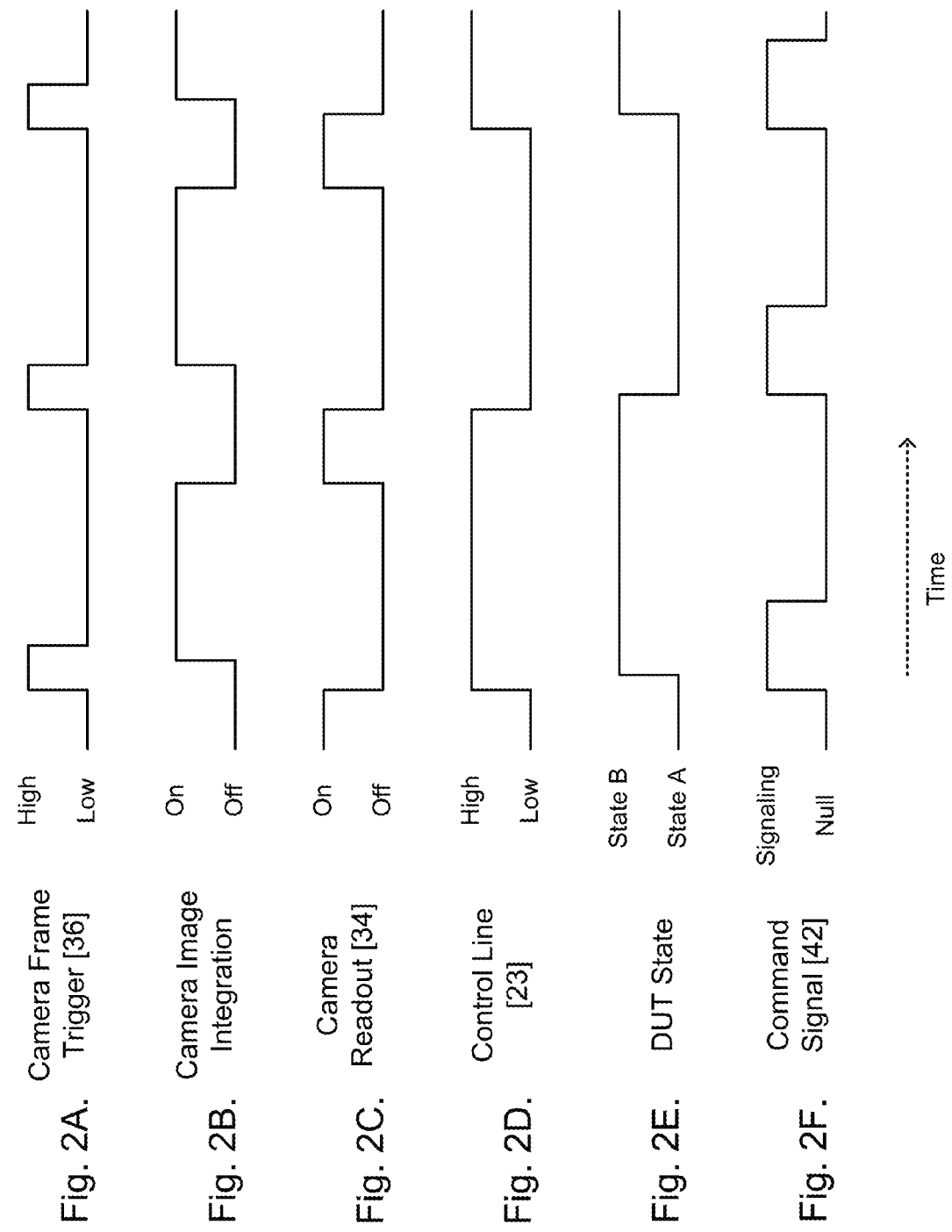
FIGS. 2A-F show exemplary timing diagrams used by the components shown in FIG. 1.

The PSTCU 24 acts as timing coordinator between the other components in FIG. 1. The timing for the case of the PSTCU 24 acting as the master controller to the slave UCU 32 with simplex communications (only digital control line 23 is in operation) is shown in FIG. 2D. The camera 26 is assumed to be in a free-running mode in which it takes image frames at a repeated fixed interval. At the beginning of a frame, a pulse is sent out by the camera 26 on the frame trigger line 36 (FIG. 2A). Internally, the camera 26 integrates incoming photons on each pixel for a period of time (FIG. 2B). The pixel values are then read out and sent via the image signal line 34 to the computing device 40 (FIG. 2C). The PSTCU 24 uses the pulse on the frame trigger line 36 to initiate two nearly simultaneous events. First, the PSTCU 24 sends out a signal on the digital control line 23 that indicates to the UCU 32 to switch the DUT 30 between a first state A to a second state B (FIGS. 2D and 2E). Second, the PSTCU 24 sends a predefined binary sequence or command signal on line 42 to the computing device 40 that indicates to the computing device 40 that it should digitally acquire the next available camera 26 frame data on line 34 and tag it as belonging to DUT state B (FIG. 2F). This same timing sequence is performed again except that control line 23 goes low, the DUT 30 is placed into state A, and the acquired camera 26 frame data is tagged as being from state A. This whole process can then be repeated as many times as desired with multiple frames being averaged to improve the signal-to-noise ratio (SNR).

In this binary sampling (two-image) mode of operation, images from state A are subtracted from images from state B to produce a difference image that is displayed by the computer. This subtraction process removes the common background with only the thermal difference between the two states present. Summing up repeated samples of the difference image adds to the signal strength, while averaging out the noise component of the background, thus improving the SNR and allowing very weak difference signals to be detected.

In one embodiment, the master/slave relationship between the PSTCU 24 and the UCU 32 is reversed with line 25 now acting as the digital control line (transmitting the digital control signal). Also, a full duplex operation in which both lines 23 and 25 are used, with the master controller sending the slave a signal to Start and the slave sending back a Done indication. Timing diagrams for these other three modes of operation can be created based on those shown FIG. 2.

The above operational mode performs similar data acquisition and image analysis as do prior-art pulse-sampling thermography (PST) systems except that, instead of controlling a voltage level, digital signaling is used to allow the DUT 30 to change states between image samples. As a result, the computing device 40 displays an image that is the difference in thermal signature between a first operational state A and a second operational state B. Possible operational states include baseline operation (e.g., a microprocessor at idle not doing any heavy processing), pulse-width modulation (PWM) cell of the DUT 30 in operation, multiplier cell of the DUT 30 in operation, etc. Importantly, these cells are components that are operated dynamically. For example, a multiplier cell functions only when the internal code operation of c=a*b is invoked and does nothing upon turning the device's power on and off Thus, study of the thermal behavior of the multiplier cell can be studied only by switching between a state in which the processor is idle, state A, and a state in which a sequence of multiplies is performed, state B.

Figure 3:
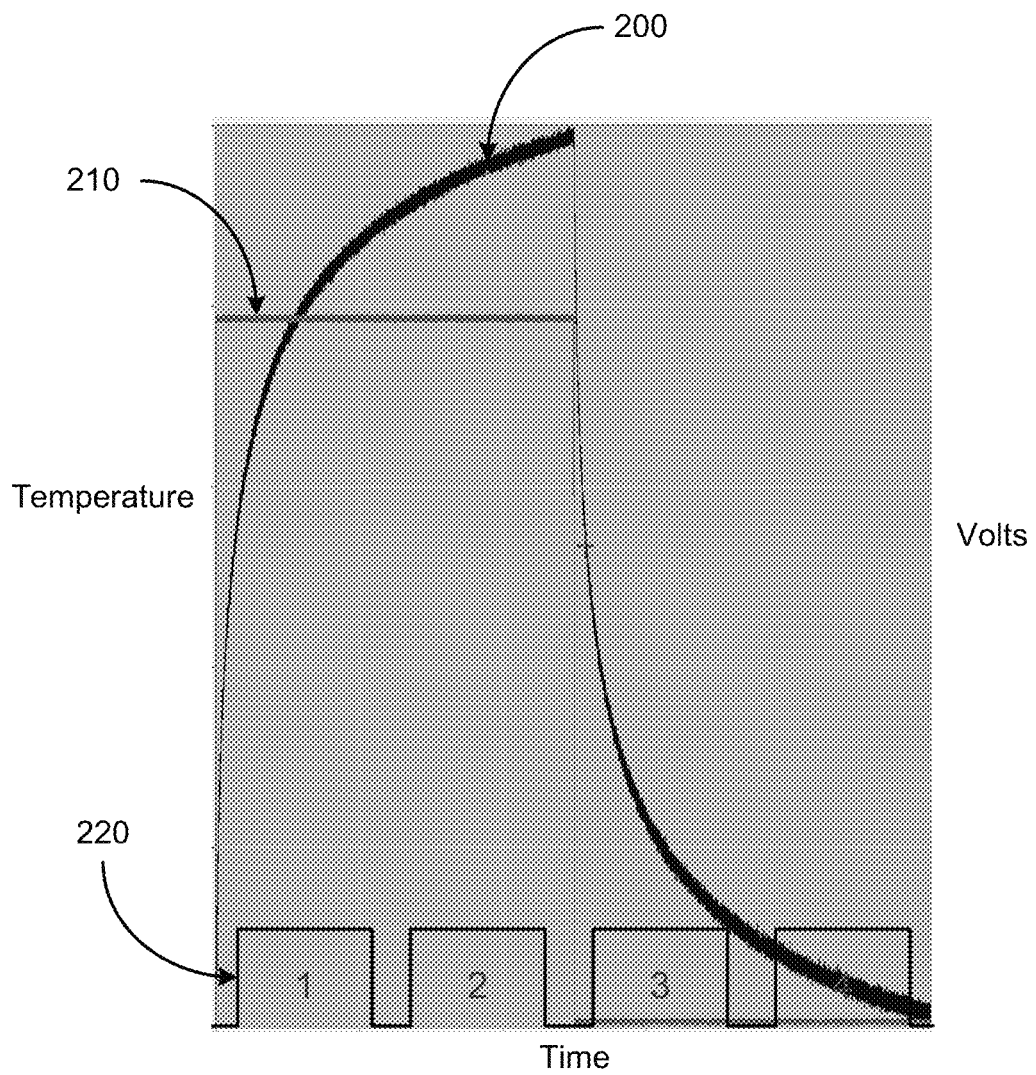
FIG. 3 illustrates an exemplary temperature-response graph in response to square wave modulation.

The functionality of the DDTM system 20 can be further extended by allowing more than one image to be acquired during each state condition. FIG. 3 shows a typical temporal thermal response 200 due to a square wave (On/Off) stimulus 210 (volts) in a semiconductor device (the DUT 30). As expected, the response 200 follows an exponential rise during the On stimulus and an exponential fall during the Off stimulus. A single pair of images, one taken during the On condition (state B) and one taken during the Off condition (state A) can be used to determine the thermal difference between the two conditions, as described previously in the binary mode of operation. However, more than one image can be acquired during each state condition. FIG. 3 shows four such frames of image acquisition 220. The high state of line 220 indicates image integration and the low state indicates no integration in direct correlation to the line of FIG. 2B. As shown, two image frames are acquired during each device state. This arrangement is often referred to as "quadrature sampling". Clearly, higher-order sampling with three or more frames taken in each state can also be performed.

For quadrature sampling, the image intensity in each frame 1 through 4 will be different, due to the temporal variation in the thermal response 200. The intensity in image 1, S1, will be less bright than the intensity in image 2, S2. Similarly, the intensity in image 4, S4, will be less bright than the intensity in image 3, S3. Various linear combinations and ratios of these four signals can produce interesting results. Past efforts have utilized a Fourier transform approach in which images are combined to produce both an in-phase and an out-of-phase image, indicating the power in the first-order Fourier component of the square wave modulation. These two images can in turn be mathematically combined to extract the relative phase of the measured signal at each pixel in the image. Although mathematically interesting, a phase image has little meaning in thermal analysis. A more interesting result would be an image of the thermal rise time that is observed in the thermal response 200 in FIG. 3. The mathematical combination of image intensities below, which can be related to the hyperbolic tangent of the ratio of the camera 26 frame period, τ, and the thermal rise time, γ, $$\frac{2(S3-S1)}{(S1+S2+S3+S4)} = \tanh(\tau/\gamma). \quad (1)$$

Thermal rise time is a very important parameter when analyzing integrated circuits. It is basically an indication of how well the circuit is being cooled, poor cooling producing a long thermal rise time. In one embodiment, the quadrature-sampling mode and above analysis are used to produce images in which the image intensities are a direct map of the thermal rise time within the circuit.

As with binary mode operation, quadrature mode operation can be analyzed with timing diagrams, however, the only difference is to have multiple image acquisitions between each change in device state. Higher-order sampling (i.e., three or more samples per device state) can also be diagrammed. FIGS. 4 through 7 illustrate exemplary flow charts for each of the acquisition modes related to Master/Slave and Simplex/Duplex operation.

These processes are illustrated as logical flow graphs, each operation of which represents a sequence of operations that can be implemented in hardware, software, or a combination thereof. In the context of software, the operations represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described operations can be combined in any order and/or in parallel to implement the processes.

Figure 4:
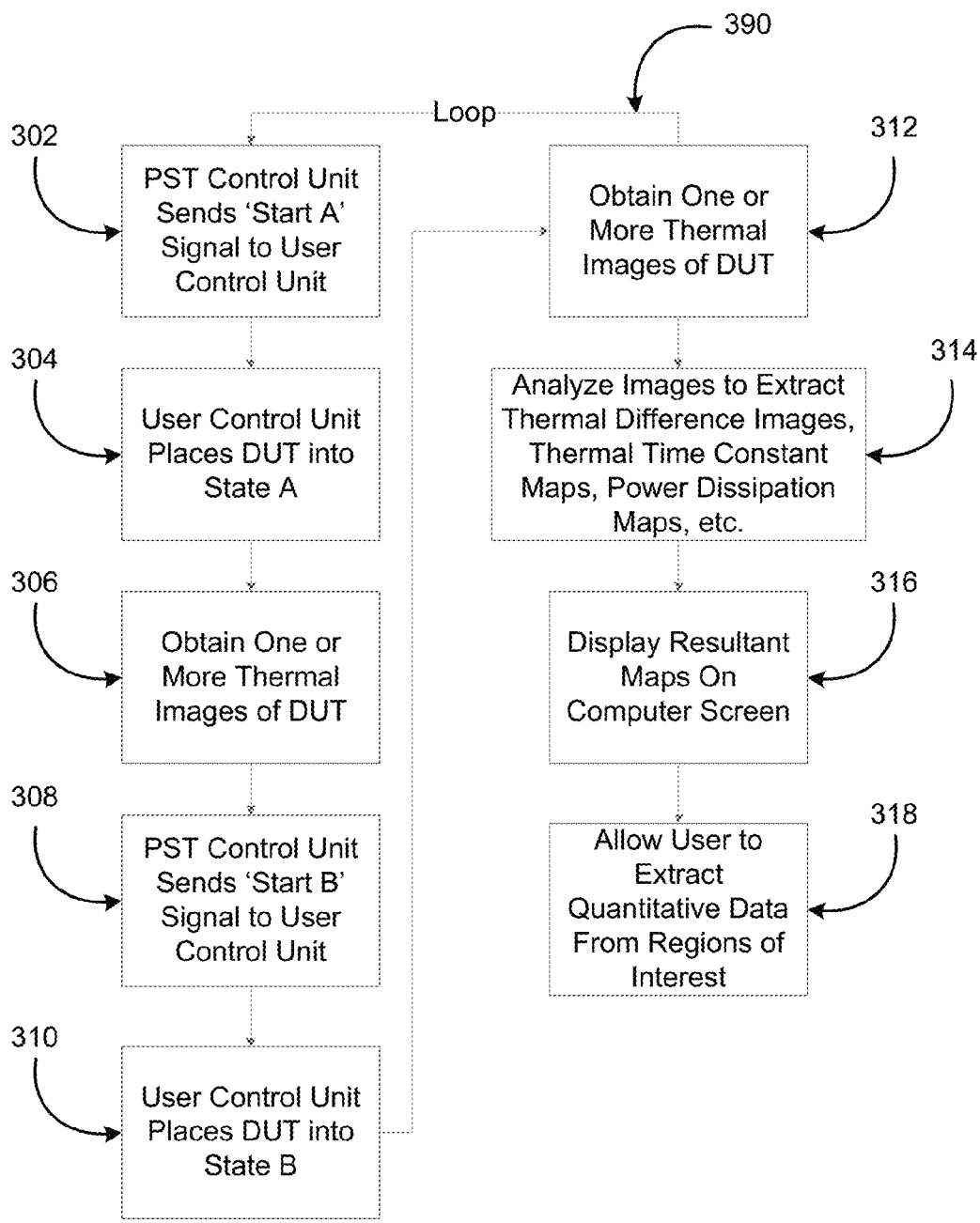
FIG. 4 is a flowchart of an exemplary master-simplex mode process.

FIG. 4 shows a flowchart for a Master-Simplex mode of operation of the DDTM system 20 in FIG. 1. First, at a block 302, the PSTCU 24 sends a 'Start A' signal to the UCU 32 by setting a signal to low on the control line 23. Next, at a block 304, the UCU 32 places the DUT 30 into a first state A, based on the low signal of the control line 23. At a block 306, the computing device 40 is instructed by the PSTCU 24 via the line 42 to acquire one or more thermal images of the DUT 30 in the first state A, as the images are obtained by the thermal camera 26. Then, at a block 308, the PSTCU 24 sends a 'Start B' signal to the UCU 32 by setting a signal to high on the line 23. Next, at a block 310, the UCU 32 places the DUT 30 into a second state B, based on the high signal on the line 23. At a block 312, the computing device 40 is instructed by the PSTCU 24 via the line 42 to acquire one or more thermal images of the DUT 30 in the second state B, as the images are obtained by the thermal camera 26. Then, at a block 314, the computing device 40 analyzes the thermal images at the two states to determine one of thermal difference images, thermal time-constant maps, power dissipation maps, or other characteristics. At a block 316, the results of the analysis are displayed on a display device associated with the computing device 40, thus allowing a user to extract quantitative data from regions of interest on the displayed images/maps, at block 318.

Figure 5:
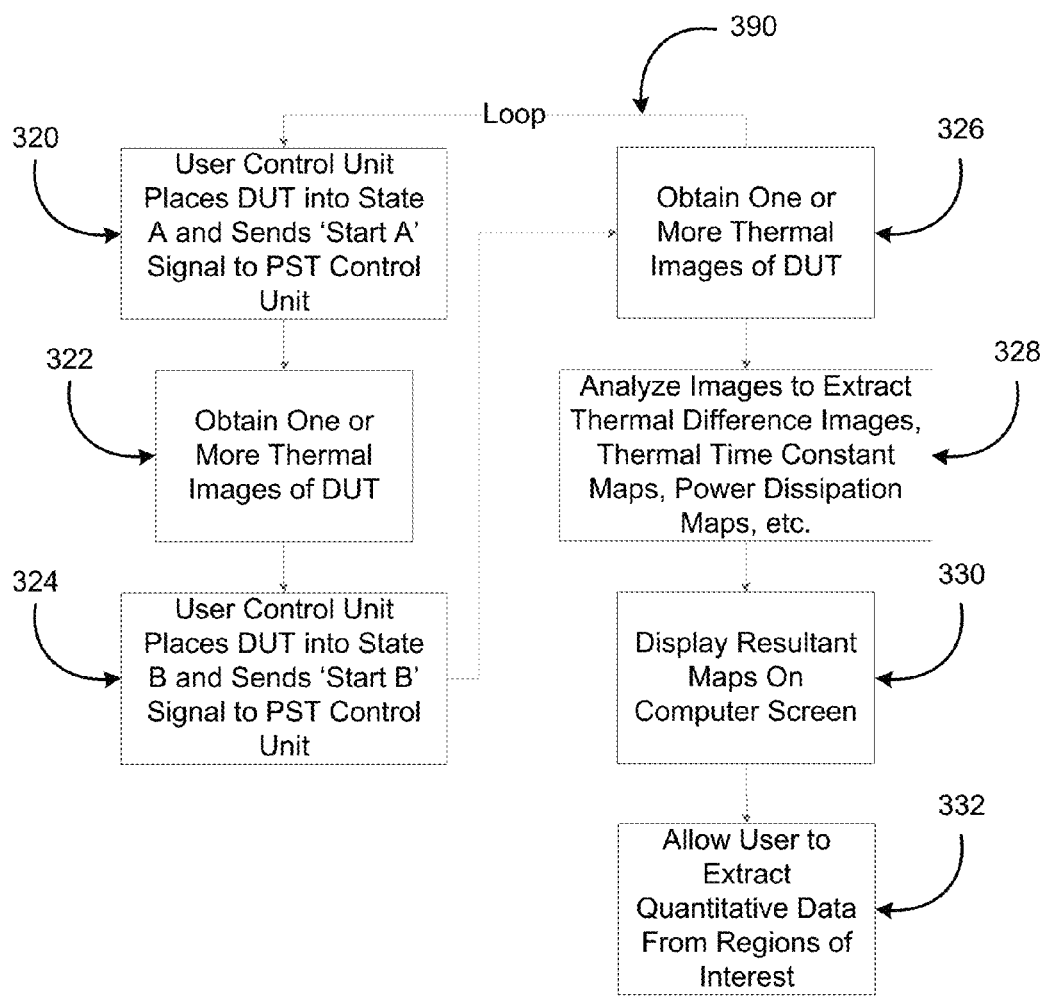
FIG. 5 is a flowchart of an exemplary slave-simplex mode process.

FIG. 5 shows a flowchart for a Slave-Simplex mode of operation of the DDTM system 20 in FIG. 1. First, at a block 320, the UCU 32 places the DUT 30 into a first state A and sends a 'Start A' signal to the PSTCU 24 by setting the signal on the line 25 to low. At a block 322, the computing device 40 is instructed via the line 42 by the PSTCU 24 based on the low signal on the line 25 to acquire one or more thermal images of the DUT 30 in the first state A, as the images are obtained by the thermal camera 26. Then, at a block 324, the UCU 32 places the DUT 30 into a second state B and sends a 'Start B' signal to the PSTCU 24 by setting the signal on the line 25 to high. At a block 326, the computing device 40 is instructed via the line 42 by the PSTCU 24 based on the high signal on the line 25 to acquire one or more thermal images of the DUT 30 in the second state B, as the images are obtained by the thermal camera 26. Then, at a block 328, the computing device 40 analyzes the thermal images at the two states to determine one of thermal difference images, thermal time-constant maps, power dissipation maps, or other characteristics. At a block 330, the results of the analysis are displayed on a display device associated with the computing device 40, thus allowing a user to extract quantitative data from regions of interest on the displayed images/maps, at block 332.

Figure 6:
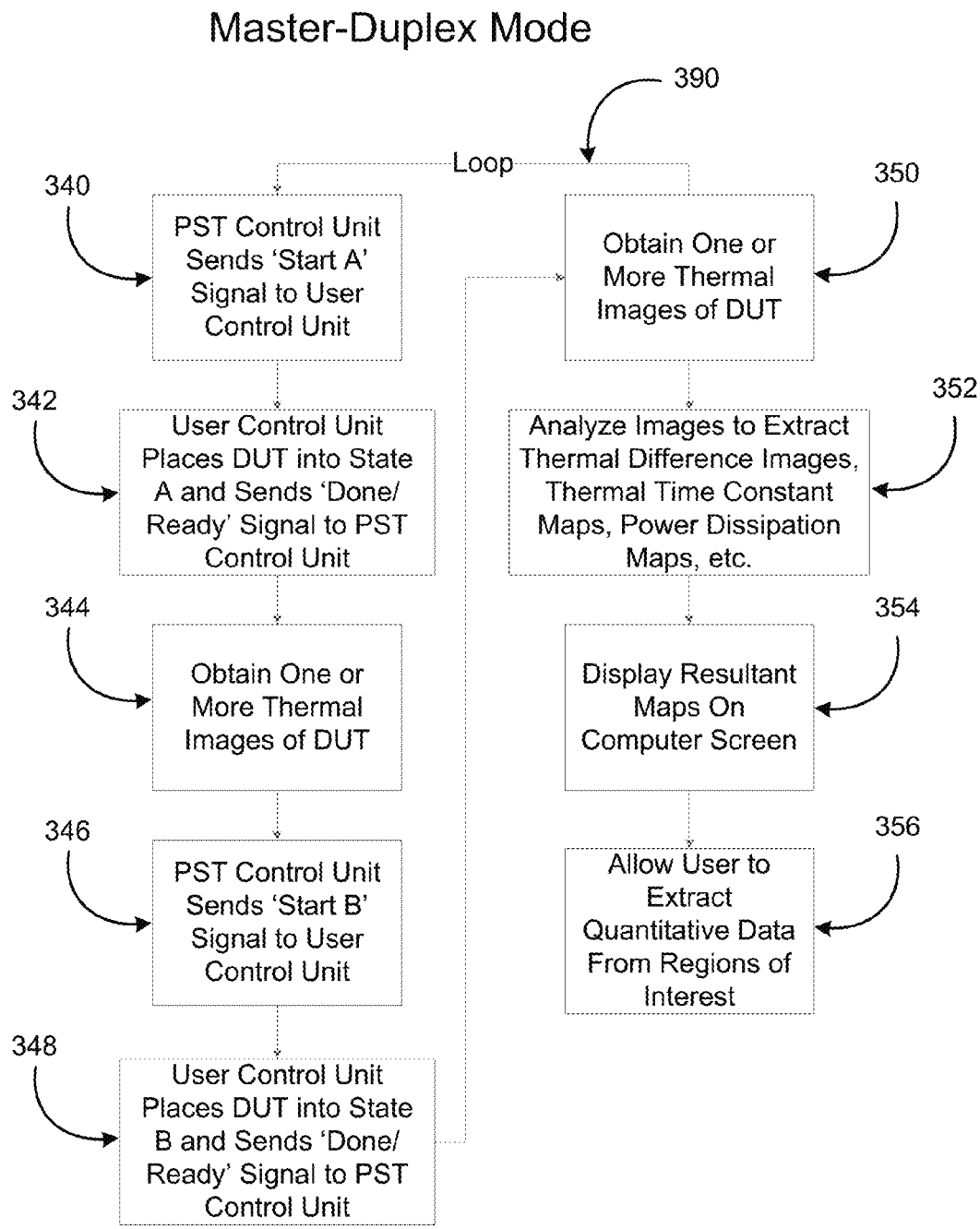
FIG. 6 is a flowchart of an exemplary master-duplex mode process.

FIG. 6 shows a flowchart for a Master-Duplex mode of operation of the DDTM system 20 in FIG. 1. First, at a block 340, the PSTCU 24 sends a 'Start A' signal to the UCU 32 by setting the signal on the line 23 to low. Next, at a block 342, the UCU 32 places the DUT 30 into a first state A, based on the low signal on the line 23, and sends a 'Done/Ready' signal to the PSTCU 24 by sending a first pulse (low-high-low) signal on the line 25. At a block 344, the computing device 40 is instructed by the PSTCU 24 via line 42 to acquire one or more thermal images of the DUT 30 in the first state A, as the images are obtained by the thermal camera 26, based on the first pulse signal on the line 25. Then, at a block 346, the PSTCU 24 sends a 'Start B' signal to the UCU 32 by setting the signal on the line 23 to high. Next, at a block 348, the UCU 32 places the DUT 30 into a second state B, based on the high signal on the line 23 and sends a 'Done/Ready' signal to the PSTCU 24 by sending a second pulse (low-high-low) signal on the line 25. At a block 350, the computing device 40 is instructed by the PSTCU 24 via line 42 to acquire one or more thermal images of the DUT 30 in the second state B, as the images are obtained by the thermal camera 26, based on the second pulse signal on the line 25. Then, at a block 352, the computing device 40 analyzes the thermal images at the two states to determine one of thermal difference images, thermal time-constant maps, power dissipation maps, or other characteristics. At a block 354, the results of the analysis are displayed on a display device associated with the computing device 40, thus allowing a user to extract quantitative data from regions of interest on the displayed images/maps, at block 356.

Figure 7:
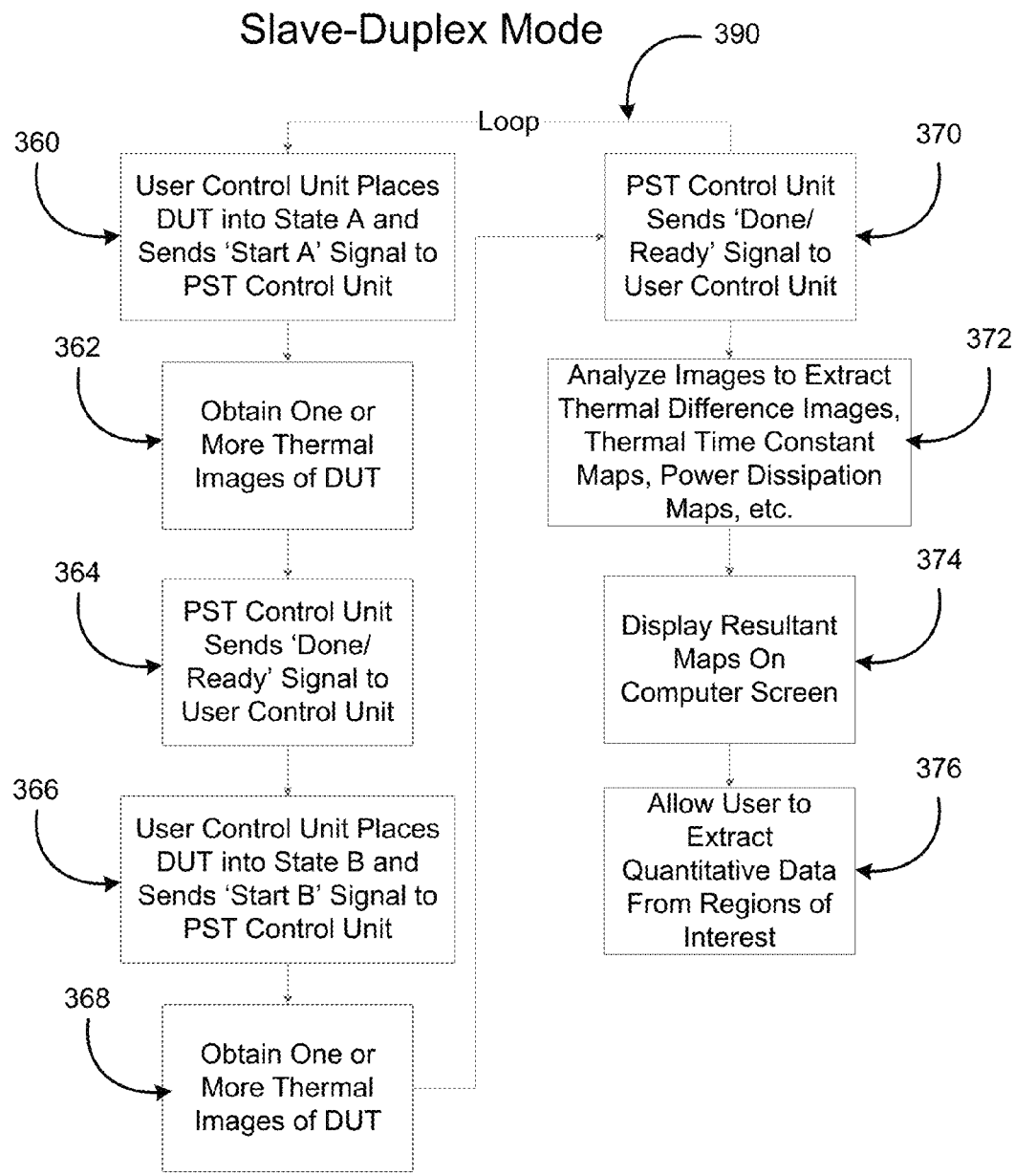
FIG. 7 is a flowchart of an exemplary slave-duplex mode process.

FIG. 7 shows a flowchart for a Slave-Duplex mode of operation of the DDTM system 20 of FIG. 1. First, at a block 360, the UCU 32 places the DUT 30 into a first state A and sends a 'Start A' signal to the PSTCU 24 by setting a signal on the line 25 to low. At a block 362, the computing device 40 is instructed by the PSTCU 24 via line 42 to acquire one or more thermal images of the DUT 30 in the first state A, as the images are obtained by the thermal camera 26, based on the low signal on the line 25. Then, at a block 364, the PSTCU 24 sends a 'Done/Ready' signal to the UCU 32 by sending a first pulse (low-high-low) signal on the line 23. Next, at a block 366, the UCU 32 places the DUT 30 into a second state B, based on the first pulse signal on the line 23, and sends a second 'Start B' signal to the PSTCU 24 by setting the signal on the line 25 to high. At a block 368, the computing device 40 is instructed by the PSTCU 24 via line 42 to acquire one or more thermal images of the DUT 30 in the second state B, as the images are obtained by the thermal camera 26, based on the high signal on the line 25. At a block 370, the PSTCU 24 sends a 'Done/Ready' signal to the UCU 32 by sending a second pulse (low-high-low) signal on the line 23. Then, at a block 372, the computing device 40 analyzes the thermal images at the two states to determine one of thermal difference images, thermal time-constant maps, power dissipation maps, or other characteristics. At a block 374, the results of the analysis are displayed on a display device associated with the computing device 40, thus allowing a user to extract quantitative data from regions of interest on the displayed images/maps, at block 376.

In all four modes of operation, the sequence can loop in order to average many images, in order to obtain increased signal-to-noise performance, and detect weak signals. This looping is shown in FIGS. 4 through 7 via the line 390.

This new modulation approach opens up a wide range of investigations into dynamic processes in both analog and digital devices, such as heat loading as a function of process parameters and reverse engineering.

The following examples represent a small subset of the potential application of these techniques.

Figure 8A:
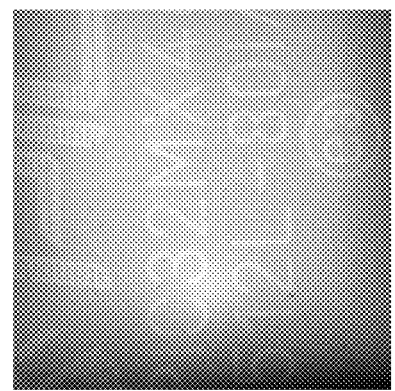
FIGS. 8a through 8c illustrate exemplary images generated by the system of FIG. 1 during a first exemplary process.

An exemplary DUT 30 is a MicroChip PIC32MX460F512L microcontroller with a standard-100 pin glass-epoxy package with a typical thickness of ~0.4 mm between the semiconductor die's active layer and the top side of the package. Several measurements were made through the package via direct observation of the heat signature propagated to the package's top using a 2× lens and thermal camera with a field of view of 6 by 6 millimeters. This field of view is roughly the same size as the underlying die, which has the active side facing upward. A reference thermal image of the device with power supplied to the DUT is shown in FIG. 8a. As can be seen by the darkening of the image toward the bottom of the image, there is a significant thermal background, simply due to its baseline dynamic operation. The goal of the differential thermal measurements is to separate out heating, due to specific active components, from this general thermal background.

A program was introduced into the microcontroller that allowed a USB communication interface. Instructions were sent to the device via the USB interface to place it into various test states, as described below. In this setup, the UCU 32 and the DUT 30, as seen in FIG. 1, are one and the same object.

In an initial demonstration, a program was loaded into the microcontroller that caused a digital output pin to switch states in response to the digital signal from the PSTCU 24—the simplest of dynamic conditions in which only the background heating is due to dynamic processes. In this example, one can discriminate between the dynamic heat sources and a single modulated component.

In one embodiment, an external resistor included in the DUT 30 circuitry controls the internal power dissipation of an output driver of the microcontroller. For the initial imagery, the internal power dissipation was set at maximum power level of ~25 mW. A differential image, FIG. 8b, was obtained via the process shown in FIG. 4. False shading (e.g., coloring) of the image is used to indicate the strength of the heating in the image. White coloring indicates very hot with lessening heat signature as the color moves through red, orange, green, then blue. This is shown as different shades in the figures. A source of peak heating 402 is readily apparent in FIG. 8b.

Figure 8B:
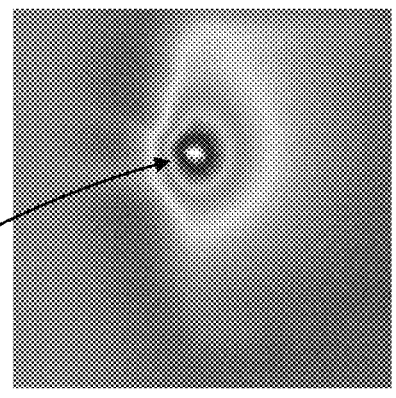
Figure 8C:
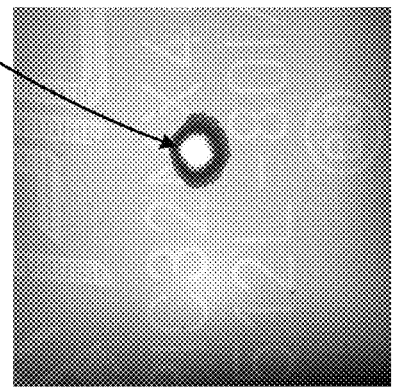

In order to visualize the position of the peak 402 with respect to the DUT image seen in FIG. 8a, the image in FIG. 8b is passed through a digital filter in which heating less than a certain value is made transparent. The user can set the transparency level by setting a threshold value. This filtered image is then overlaid onto the reference image in FIG. 8a, the image being used as a spatial reference image. The result is shown in FIG. 8c wherein the peak heat signature from FIG. 8b is clearly located on the DUT 30.

Further, as the internal power dissipation is controlled by the external resistor, a sequence of differential images can be taken with differing power levels. The measured intensity of the peak heating 402 at these different power levels can then be used as a calibration curve for determining the power dissipation of other components of the DUT 30.

Figure 9A:
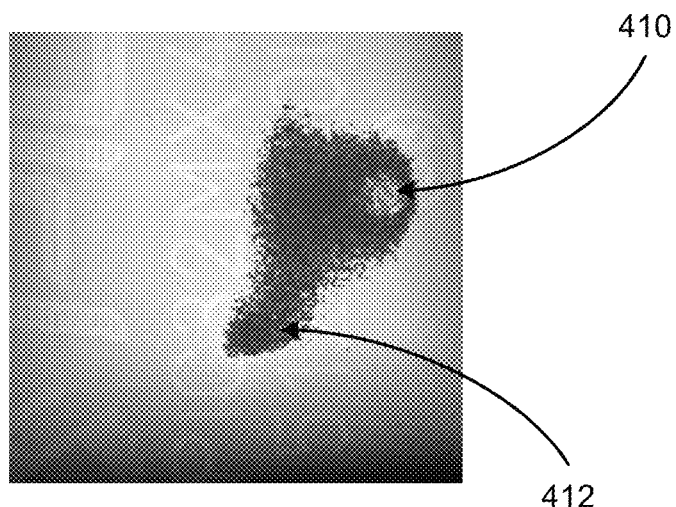
FIGS. 9a and 9b illustrate exemplary images generated by the system of FIG. 1 during a second exemplary process.

In another embodiment, the signal and the background were made to be dynamic processes by setting the control program to switch between running a sequence of no-ops in state A and either a repeating sequence of multiplies or a sequence of memory swaps (read variable 1, swap to variable 2, save variable 2) in state B. The overlaid results are shown in FIG. 9a for the multiplies and FIG. 9b for the memory swaps. Both operations have a common area heating up, peak 412, and a second heat source on the upper right for the multiply, peak 410, and on the upper left for the memory swap, peak 414. The location of these hotspots can be correlated to operational circuitry.

Figure 9B:
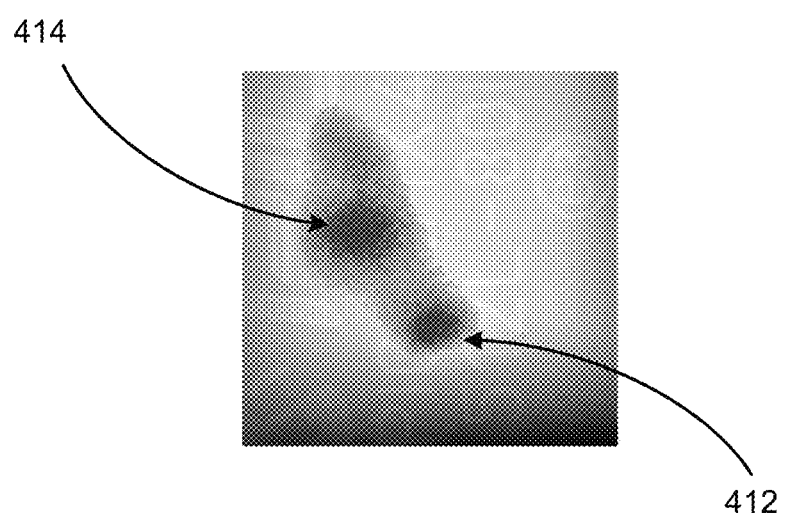

Moreover, the calibration generated by exercising the output pin described above, can be used as a calibration source to estimate the power dissipation at these hotspots. In FIG. 9a, the peak 410 is estimated to have internal power dissipation of 3.2 milliwatts and the peak 412 is estimated at 2.7 milliwatts. In FIG. 9b, the estimated power dissipation for both of the peaks 412 and 414 is 4.2 milliwatts. These results present a technique for in situ verification of expected location and magnitude of internal heating from these two dynamic processes.

Figure 10A:
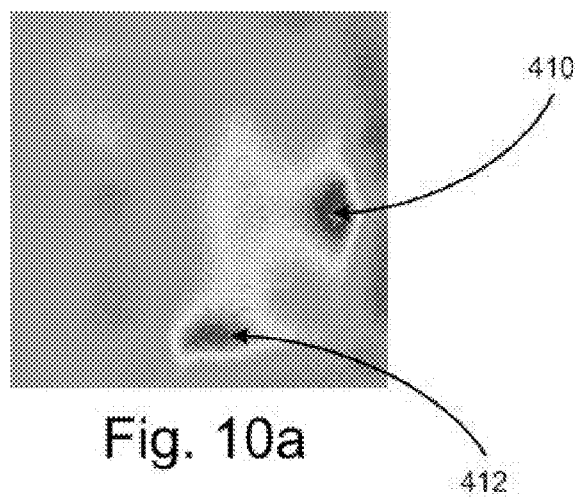
FIGS. 10a through 10c illustrate exemplary images generated by the system of FIG. 1 during a third exemplary process.
Figure 10B:
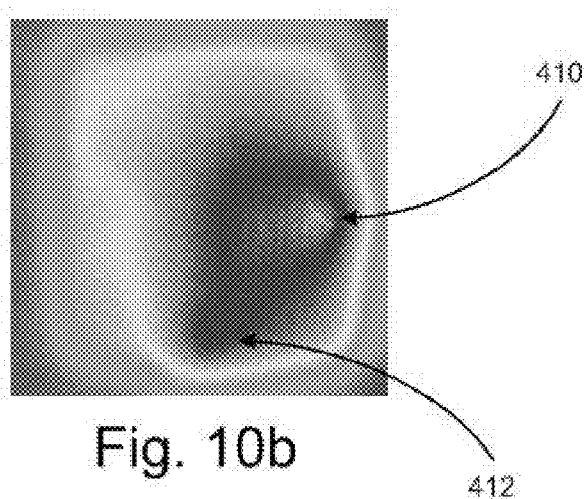
Figure 10C:
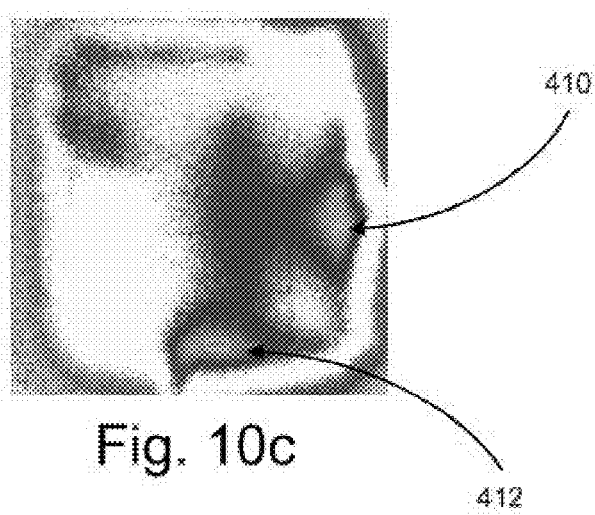

In a further embodiment, the signal and the background are again made to be dynamic processes by setting the control program to switch between running a sequence of no-ops in state A and a repeating sequence of multiplies in state B. However, unlike the previous binary sampling, quadrature sampling is used to produce four images, two taken during state A and two taken during state B, as indicated previously in FIG. 3. Many different mathematical combinations of these four images can be produced. Three images of particular interest are shown in FIGS. 10a through 10c. FIG. 10a is produced by displaying the mathematical combination of the four image intensities given by S1+S2−S3−S4, which produces an indication of the heating early in time. FIG. 10b is the mathematical combination of the four image intensities given by −S1+S2+S3−S4 and produces an indication of the heating later in time. The two thermal peaks 410 and 412 seen in FIG. 9a (using binary sampling) are apparent in both images. However, the location of the peaks in FIG. 10a are more clearly defined, as the heat has had less time to spread. Moreover, examination of the FIGS. 10a and 10b shows how the heat is spreading through the DUT 30 in time. This heat flow is defined by producing an image based on inverting the Equation (1) above to extract the thermal rise time g. An image of the thermal rise time is shown FIG.

10*b*. As with the previous images, false color/shade is used to show the different time constants, where red indicates very short time constants, with time constant increasing to 200 milliseconds as the color moves through red, orange, green, then blue. Note that the overall white background is this image is an artifact of insufficient signal and not an indication of a thermal rise time. As shown, the time constant is shortest near the heat source peaks 410 and 412 and becomes longer as the heat takes time to flow away from the sources. The heat flow path is clearly defined from this image. The combination of peak heating and heat flow derived from these images can be utilized in designing efficient heat extraction and in locating overheating sites.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The invention claimed is:

1. A system comprising:
   a device under test (DUT);
   a thermal camera configured to produce a plurality of thermal images of the DUT;
   a computer device in data communication with the thermal camera, the computer device comprising a processing device and an output device; and
   a control unit in data communication with the DUT and at least one of the thermal camera or the processing device;
   wherein the DUT is caused to run in a first operational state in response to a first framing signal that is generated by the thermal camera to indicate a first timing of a first frame sequence of the thermal camera, and wherein the processing device is configured to acquire a first thermal image of the DUT from the thermal camera based on the first framing signal,
   wherein the DUT is caused to run in a second operational state in response to a second framing signal that is generated by the thermal camera to indicate a second timing of a second frame sequence of the thermal camera, and wherein the processing device is configured to acquire a second thermal image of the DUT from the thermal camera based on the second framing signal, and
   wherein the processing device is configured to generate at least one output image based on a difference between the first thermal image and the second thermal image.

2. The system of claim 1, wherein the at least one output image comprises at least one of a thermal difference image, a thermal time-constant map, or a power dissipation map.

3. The system of claim 1, wherein at least one of the first operational state or the second operational state comprises an active operational state.

4. The system of claim 3, wherein the active operational state comprises a state of a cell device within an integrated circuit of the DUT.

5. The system of claim 4, wherein the cell device comprises at least one of a modulated cell or a mathematical operation cell.

6. The system of claim 5, wherein the modulated cell comprises a pulse-width modulation cell and the mathematical operation cell comprises a multiplier cell.

7. The system of claim 1, wherein the control unit comprises a first control unit located at the DUT and a pulse-sampling thermography control unit, wherein the first control unit is in signal communication with the pulse-sampling thermography control unit and the pulse-sampling thermography control unit is in signal communication with at least one of the computer device or the thermal camera.

8. The system of claim 1, wherein the processing device acquires the first thermal image of the DUT from the thermal camera based on a third signal.

9. A system comprising:
   a device under test (DUT);
   a thermal camera configured to produce a plurality of thermal images of the DUT;
   a computer device in data communication with the thermal camera, the computer device comprising at least one processing device and an output device;
   a control unit associated with the DUT; and
   a pulse-sampling thermography control unit being in signal communication with the control unit and the thermal camera,
   wherein the control unit causes the DUT to operate in a first operational state based on a first framing signal that is a first digital pulse generated by the thermal camera to indicate a first timing of a first frame sequence of the thermal camera;
   wherein the pulse-sampling thermography control unit instructs the processing device to acquire a first thermal image of the first operational state of the DUT from the thermal camera based on the first framing signal,
   wherein the control unit causes the DUT to operate in a second operational state based on a second framing signal that is a second digital pulse generated by the thermal camera to indicate a second timing of a second frame sequence of the thermal camera,
   wherein the pulse-sampling thermography control unit instructs the processing device to acquire a second thermal image of the second operational state of the DUT from the thermal camera based on the second framing signal, and
   wherein the processing device is configured to generate at least one output image based on a difference between the first thermal image and the second thermal image.

10. The system of claim 9, wherein the at least one output image comprises at least one of a thermal difference image, a thermal time-constant map, or a power dissipation map.

11. The system of claim 9, wherein at least one of the first operational state or the second operational state comprises an active operational state.

12. The system of claim 11, wherein the active operational state comprises a state of a cell device within an integrated circuit of the DUT.

13. The system of claim 12, wherein the cell device comprises at least one of a modulated cell or a mathematical operation cell.

14. The system of claim 13, wherein the modulated cell comprises a pulse-width modulation cell and the mathematical operation cell comprises a multiplier cell.

15. The system of claim 9, wherein the pulse-sampling thermography control unit sends a completion signal to the control unit after a predefined period of time after instructing the processing device to acquire the first thermal image,
   wherein the control unit places the DUT in the second operational state based on the completion signal.

16. A method comprising:
   causing, by a control unit and based on a first framing signal that is generated by a thermal camera to indicate a first timing of a first frame sequence of the thermal camera, a device under test (DUT) to operate in a first operational state and a processing device to acquire, from the thermal camera, a first thermal image of the DUT in the first operational state;

causing, by the control unit and based on a second framing signal that is generated by the thermal camera to indicate a second timing of a second frame sequence of the thermal camera, the DUT to operate in a second operational state and the processing device to acquire, from the thermal camera, a second thermal image of the DUT in the second operational state;

generating at least one output image based on a difference between the first thermal image and the second thermal image, and presenting the at least one output image.

17. The method of claim 16, wherein the at least one output image comprises at least one of a thermal difference image, a thermal time-constant map, or a power dissipation map.

18. The method of claim 16, wherein at least one of the first operational state or the second operational state comprises an active operational state.

19. The method of claim 18, wherein the active operational state comprises a state of a cell device within an integrated circuit of the DUT.

20. The method of claim 19, wherein the cell device comprises at least one of a pulse-width modulation cell and a multiplier cell.

* * * * *